United States Patent [19]

Goff et al.

[11] 4,410,612
[45] Oct. 18, 1983

[54] ELECTRICAL DEVICE FORMED FROM POLYMERIC HEAT RESISTANT PHOTOPOLYMERIZABLE COMPOSITION

[75] Inventors: David L. Goff, Springfield; Edward L. Yuan, Philadelphia, both of Pa.; Stephen Proskow, Wilmington, Del.

[73] Assignee: E. I. Du Pont de Nemours and Company, Wilmington, Del.

[21] Appl. No.: 334,166

[22] Filed: Dec. 24, 1981

Related U.S. Application Data

[63] Continuation-in-part of Ser. No. 183,648, Sep. 3, 1980, Pat. No. 4,329,419.

[51] Int. Cl.$^3$ .................................................. G03C 5/00
[52] U.S. Cl. ........................................ 430/18; 430/11; 430/283; 430/311; 430/272; 430/319; 430/330; 428/901
[58] Field of Search ............... 430/283, 285, 288, 311, 430/11, 18, 272, 330; 204/153.15, 159.19; 428/542, 901

[56] References Cited

U.S. PATENT DOCUMENTS

| 3,380,831 | 4/1968 | Cohen et al. | 430/288 |
| 3,479,185 | 11/1969 | Chambers | 430/271 |
| 3,552,973 | 1/1971 | Fishman | 430/340 |
| 3,594,410 | 7/1971 | Cohen et al. | 560/224 |
| 3,623,870 | 11/1971 | Curran et al. | 430/330 |
| 3,784,557 | 1/1974 | Cescon | 548/336 |
| 3,953,877 | 4/1976 | Sigusch et al. | 357/72 |
| 3,957,512 | 5/1976 | Kleeberg et al. | 430/325 |
| 4,040,831 | 8/1977 | Rubner et al. | 430/325 |
| 4,093,461 | 6/1978 | Loprest et al. | 430/193 |
| 4,117,196 | 9/1978 | Mathias | 428/379 |
| 4,132,812 | 1/1979 | Mathias | 427/44 |
| 4,188,224 | 2/1980 | Felder et al. | 204/159.15 |

Primary Examiner—Jack P. Brammer
Attorney, Agent, or Firm—Hilmar L. Fricke

[57] ABSTRACT

An electrical device formed from a polymeric heat resistant photopolymerizable composition of a polyamide ester, resin containing photopolymerizable groups which forms a relief structures on electrical devices such as capacitors, integrated circuits, printed circuits, multilayer circuits or semiconductors; a solution of the composition is applied to a substrate such as a coated silicon wafer, dried to form a film, the film is exposed to radiation through a pattern and photopolymerized; the unexposed and unpolymerized part of the film is dissolved off and the resulting relief structure is converted to a polyimide structure with sharp definition and has good mechanical, chemical and electrical properties; to reduce radiation exposure time and increase the rate of photopolymerization the following constituents are used in the composition: a radiation sensitive polymerizable polyfunctional acrylate compound and a photopolymerization initiator of an aromatic biimidazole.

10 Claims, No Drawings

ELECTRICAL DEVICE FORMED FROM POLYMERIC HEAT RESISTANT PHOTOPOLYMERIZABLE COMPOSITION

CROSS REFERENCE TO RELATED APPLICATIONS

This application is continuation-in-part application of Ser. No. 183,648 filed Sept. 3, 1980, now U.S. Pat. No. 4,329,419.

BACKGROUND OF THE INVENTION

This invention relates to improved electrical devices such as semiconductors, capacitors or printed circuits formed from compositions.

Photopolymerizable polymeric compositions used to form relief structures on electrical devices are well known as shown in Sigusch et al. U.S. Pat. No. 3,953,877 issued Apr. 27, 1976, Kleeberg et al. U.S. Pat. No. 3,957,512 issued May 18, 1976 and Rubner et al. U.S. Pat. No. 4,040,831 issued Aug. 9, 1977 now U.S. Pat. No. Re. 30,186 reissued Jan. 8, 1980. These compositions have limited commercial use since the radiation exposure time required to photopolymerize these compositions is too long for a modern process. In an efficient contact printing process, exposure times of 1 minute and preferably of 30 seconds or less are needed. The electrical devices of this invention are formed from an improved composition that can be photopolymerized in a relatively short time period of exposure to radiation.

SUMMARY OF THE INVENTION

An Electrical device formed from an improved radiation polymerizable composition of a polyamide ester resin containing photopolymerizable groups and solvent for the resin; the improvement that is used in this composition is as follows:

(a) radiation sensitive polymerizable polyfunctional acrylate compound and (b) photopolymerization initiator of aromatic biimidazole.

DESCRIPTION OF THE INVENTION

The improved radiation polymerizable composition is used to form relief structures on electrical devices such as capacitors and semiconductors. A solution of the composition is applied to a substrate such as a silicon wafer coated with a silicon dioxide layer and dried and forms a film on the substrate. The film is then exposed to radiation through a pattern and photopolymerized to form a relief structure. The unexposed and unpolymerized part of the film is dissolved off with a developer solution. The resulting relief structure is baked to remove the material not stable to heat and to form a polyimide structure with a sharp definition and with good mechanical, chemical and electrical properties.

To reduce radiation exposure time and increase the rate of photopolymerization, of a composition of a polyamide ester resin containing photopolymerizable groups, the following constituents are used in the composition:

about 5-30% by weight, based on the weight of resin, of radiation sensitive polymerizable polyfunctional acrylate compound and about 0.5-15% by weight, based on the weight of the resin, of photopolymerization initiator of aromatic biimidazole.

Typically useful radiation sensitive polymerizable polyfunctional acrylate compounds are as follows: trimethylol propane trimethacrylate, trimethylol propane triacrylate, trimethylol propane ethoxylate trimethacrylate, trimethylol propane ethoxylate triacrylate, trimethylol propane polyethoxylate trimethacrylate, trimethylol propane polyethoxylate triacrylate and mixtures thereof. Preferred are trimethylol propane polyethoxylate triacrylate having a weight average molecular weight of molecular weight of about 500-1500 and trimethylol propane ethoxylate triacrylate, pentaerythritol triacrylate, polyethylene glycol diacrylate, triethylene glycol diacrylate, polyethylene glycol dimethacrylate, polymethylene diacrylate, polymethylene dimethacrylate, trimethylene glycol dimethacrylate.

All molecular weights made reference to herein are determined by gel permeation chromatography.

Typical aromatic biimadazole photo-polymerization initiators are disclosed by Chambers U.S. Pat. No. 3,479,185 issued Nov. 18, 1969 and Cescon U.S. Pat. No. 3,784,557 issued Jan. 8, 1974 which are hereby incorporated by reference. A 2,4,5-triphenyl imidazolyl dimer having an ortho substituent on the 2 phenyl ring is a particularly useful initiator. Typical initiators of this type are 2-o-chlorophenyl-4,5 diphenyl imidazolyl dimer, 2-(o-fluorophenyl)-4,5-diphenylimidazolyl dimer, 2-(o-methoxyphenyl) 4,5-diphenyl-imidazolyl dimer. Particularly preferred are bis (2-o-chlorophenyl-4,5-diphenylimidazolyl) and bis[2-o-chlorophenyl-4,5-di-(m-methoxy phenyl) imidazolyl] since their initiators are stable and are excellent photo polymerization initiators.

Also, hexaaryl biimidazoles can be used as photopolymerization initiators as shown in Fishman U.S. Pat. No. 3,552,973 issued Jan. 5, 1971.

To enhance the photopolymerization, hydrogen donors, photoinitiators, photosensitizers or mixtures thereof in amounts about 0.1-10% by weight, based on the weight of the resin, can be used in the composition. Typically useful compounds include aromatic ketones such as benzophenone, Michler's ketone [4,4'-bis(dimethylamino)benzophenone], 4,4'-bis(diethylamino)benzophenone, 4-acryloxy-4'-diethylaminobenzophenone, 4-methoxy-4'-dimethylaminobenzophenone, 2-ethylanthraquinone, phenanthraquinone, 2-t-butylanthraquinone, 1,2-benzanthraquinone, 2,3-benzanthraquinone, 2,3-dichloronaphthoquinone, benzil dimethyl ketal, and other aromatic ketones such as disclosed in aforementioned U.S. Pat. No. 3,552,973; benzoin, benzoin ethers such as benzoin methyl ether, benzoin ethyl ether, benzoin isobutyl ether, and benzoin phenyl ether, methylbenzoin, ethylbenzoin and other benzoins.

It is preferred to have a compound present that changes color when polymerization is complete and that is a hydrogen donor that provides a rapid start for polymerization. Leuco dyes can be used such as those disclosed in aforementioned U.S. Pat. No. 3,552,973 col. 6, line 6 to col. 11, line 9 which disclosure is hereby incorporated by reference. Typically useful dyes are alkyl amino-aromatic alkanes such as tris(diethylamino-o-tolyl) methane, tris(dimethylamino-o-oxylyl) methane and tris(dipropyl amino-o-tolyl) methane.

The photopolymerizable resin used in the composition can be any type of resin that contains olefinic unsaturated groups that are photopolymerizable and that will form a polymer with good thermal, electrical and chemical properties. Polyamide ester resins are particularly useful. These resins are prepared according to the aforementioned Rubner U.S. Patent No. Re. 30,186 wherein an aromatic polycarboxylic acid anhydride is esterified with a hydroxy alkyl acrylate or methacrylate which is then reacted with diamine. Typical aromatic polycarboxylic acid anhydrides and diamines are disclosed in Edwards U.S. Pat. No. 3,179,614 issued Apr. 20, 1965 which disclosure is hereby incorporated by reference.

Typical hydroxy alkyl acrylates and methacrylates are as follows: hydroxyethyl acrylate, hydroxypropyl acrylate, hydroxy butyl acrylate, hydroxy ethyl methacrylate, hydroxypropyl methacrylate, hydroxybutyl methacrylate and the like.

Typically useful polyamide ester resins have the following structure:

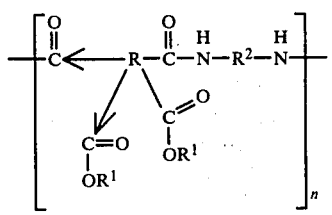

where the → denotes isomerism, R is an aromatic radical, $R^1$ is an organic radical containing a photo polymerizable olefinic double bond, $R^2$ is an aromatic, aliphatic or cycloaliphatic radical and n is a positive integer sufficiently large to provide the resin with a weight average molecular weight of about 5,000 to 75,000.

One particularly useful polyamide ester resin is the reaction of pyromellitic dianhydride, hydroxy ethyl methacrylate and oxydianiline having a weight average molecular weight of about 15,000–60,000.

Typical solvents that can be used alone or in combination to dissolve the polymer and to dilute the composition to an application viscosity are N-methylpyrrolidone, butyrolactone, ethylene glycol monoethyl ether, dimethyl formamide, dimethyl acetamide and hexamethylphosphoric acid triamide.

Preferably, the composition contains about 10–50 percent by weight, based on the weight of the composition, of polyamide ester resin containing photopolymerizable groups and about 50–90 percent by weight, based on the weight of the composition, of a solvent for the resin.

Blends of these solvents with a nonsolvent can be used as a developer solution to remove resin that was not exposed to radiation and not polymerized.

Typical developer solutions are 4-butyrolactone/toluene in a weight ratio from 20/1 or less to 1/4, dimethyl formamide/ethanol in a weight ratio from 20/1 to 1/4.

Plasticizers can also be added to the composition in amounts of 0.1–10% by weight, based on the weight of the resin. Typical plasticizers are tricresyl phosphate, dioctyl phthalate, dihexyl phthalate, dinonyl phthalate, polyethylene glycol ethers, ethylene glycol dicaprolate.

In the process for applying the composition to substrates, the composition is applied and then dried to form a film at about 30° to 100° C. for about 20 minutes to 5 hours. The film is then exposed through a pattern for about 1 second to 5 minutes. Preferably, for a commercial process exposure times of 1–60 seconds are required and usually an exposure time under 30 seconds is much preferred. Typical radiation sources used are ultraviolet lamps providing a wave length of 250 to 400 nanometers and an intensity of 0.5–60 milliwatts per square centimeter (mW/cm$^2$). After exposure, the film is then dipped or sprayed, with a developer solution and washed with a nonsolvent and then dried. The film is converted to a polyimide relief structure by baking at about 200°–400° C. for about 20 minutes to 4 hours. During conversion all the acrylate components are decomposed leaving a polyimide structure which is formed. The resulting relief structure has a sharp definition, good chemical, electrical and mechanical properties.

Typical uses for the compositions are as follows: protective coatings for semiconductors, dielectric layers for multilayer integrated circuits, high temperature solder mask, multilayer circuits, a final passivating coating on electrical devices, a photoresist and the like.

The following examples illustrate the invention. All parts and percentages are on a weight bases and molecular weights are determined by gel permeation chromatography.

EXAMPLE 1

| Composition A | Grams |
|---|---|
| Polyamide ester resin (polymer of pyromellitic dianhydride and esterified with hydroxy ethyl methacrylate and reacted with 4,4'-oxydianiline and having a weight average molecular weight of about 25,000 prepared according to Example 2 of above U.S. Reissue Pat. No. 30,186) | 10.00 |
| Bis(2-o-chlorophenyl-4,5-diphenylimidazolyl) | 0.70 |
| Michler's ketone (tetramethyl diaminobenzophenone) | 0.25 |
| Tris(diethylamino-o-tolyl)methane | 0.25 |
| Trimethylol propane polyethoxylate triacrylate having a weight average molecular weight of about 1200 | 2.0 |
| N—methylpyrrolidone | 30.00 |
| Total | 43.20 |

The above constituents are charged into a container and the container is placed on a roller and mixed for about 2 hours and then the resulting composition is filtered through a 1 micron filter.

A 2 inch diameter silicon wafer having a silicon dioxide coating is held at 300° C. for 10 minutes, cooled to room temperature and then is coated with an aminosilane adhesion promoter solution by a spin coating techniques wherein the wafer is rotated at 3000 rpm for 30 seconds after the adhesion promotor solution is applied. The above prepared Composition A is reduced as follows: 10 parts Composition A to 1 part thinner (ethylene glycol monoethyl ether/n-methyl pyrrolidone—1/1 weight ratio) and the reduced composition is applied by the above spin technique using 3000 rpm for 10 seconds. The composition is exposed to an infrared (IR) light during the spin application. The coating of Composition A is then dried for 2 hours at 55° C. to provide a film about 12,500 Angstroms thick. The coated wafer is placed in a contact printer having a 500 Watt ultraviolet light source of 356 nanometers (nm) and an intensity of about 25 mW/cm$^2$ using a mask with lines spaced 4 microns apart and exposed for 5 seconds. The wafer is then developed by dipping the wafer for 10 seconds in a 1/1 solution of 4-butylrolactone/toluene and then rinsed for 5 seconds with a spray of toluene to remove an unexposed composition. The wafer then is cured at 300° C. for 1 hour to provide a relief structure about 4,500 Angstroms thick.

Additional silicon wafers are prepared using the above procedure except the following exposure times are used 15 seconds, 20 seconds, 30 seconds, 45 seconds and 60 seconds. Exposure times of 15 and 20 and 30 seconds result in clearly defined images which are acceptable but longer exposure times of 45 and 60 seconds result in poorer images due to over exposure.

Additional silicon wafers are prepared using the above identical procedure except the following developer compositions are used: 4-butyrolactone/toluene in the following weight ratio 1/1.2, 1/1.4 and 1/1.6. All developers were adequate and gave an acceptable product.

Composition B which is representative of known compositions is prepared as follows:

|  | Grams |
|---|---|
| Polyamide ester resin (described above) | 128.6 |
| N—phenyl maleimide | 6.4 |
| Michler's ketone | 2.60 |
| N—methyl pyrrolidone | 300.00 |
| Total | 437.6 |

The constituents are mixed together using the same procedure as above and a silicon wafer is coated with the above adhesion promotor and with Composition B using the above coating and drying procedures. The coated wafer than is exposed as above (15, 20, 30, 45 and 60 seconds) to the aforementioned light source and developed using 4-butyrolactone/toluene ratio 1/1 developer solution. The coating is then cured as above. An underexposed unacceptable relief structure is formed. Exposure time to the light source had to be increased to 3.5 minutes before an acceptable image was formed.

EXAMPLE 2

The following compositions are prepared by mixing the constituents as in Example 1:

| Composition | C | D | E | F |
|---|---|---|---|---|
|  | (grams) | | | |
| Polyamide ester resin (described in Example 1) | 10.0 | 10.0 | 10.0 | 10.0 |
| Bis(2-o-chlorophenyl-4,5-diphenyl imidazolyl) | 0.7 | 0.7 | — | — |
| Michler's ketone | 0.25 | 0.25 | 0.2 | 0.2 |
| Benzophenone | — | — | 0.8 | 0.8 |
| Tris(diethylamino-o-tolyl)methane | 0.20 | 0.20 | — | — |
| Trimethylol propane trimethacrylate | 2.0 | — | 2.0 | — |
| Trimethylol propane triacrylate | — | 2.0 | — | 2.0 |
| N—methyl pyrrolidone | 30 | 30 | 30 | 30 |
| Thinner (ethylene glycol monoethyl ether/n-methyl pyrrolidone 1/1 ratio) | 10 | 10 | 10 | 10 |

The resulting compositions are each coated onto a silicon wafer primed as in Example 1 with an adhesion promoter using the coating and baking procedure of Example 1. Each of the coatings then is exposed through a mask described in Example 1 for 1 minute using a 200 Watt light source having a surface intensity of 5.0 mW/cm² in the contact printer. Each of the coated wafers is developed in a 4-butyrolactone/toluene ratio of 1/3 developer solution for 20 seconds and rinsed for 10 seconds with toluene and cured as in Example 1. All wafers have acceptable images. The wafer made with Composition D has the best and most clear image. The wafer made with Composition C has the next best image which is better than the wafers made with Compositions E and F. The image on the wafer made with Composition F is slightly better than the image on the wafer made with Composition E.

Composition B of Example 1 is coated onto a silicon wafer primed as in Example 1 using the above procedure. A 1 minute exposure time gave an underexposed unacceptable image. Exposure times had to be increased to about 5–7 minutes to provide a clear and distinct image on the wafer.

We claim:

1. An electrical device having at least one semiconductive dielectric layer and a relief structure thereon; wherein the relief structure consists of a stable heat resistant polyimide material formed by applying a solvent soluble radiation sensitive polyamide ester resin composition to a substrate, drying the composition, exposing the composition to radiation through a pattern, dissolving the unradiated portions and converting the resulted relief structure by heating to form a polyimide structure and wherein the polyamide ester resin composition consists essentially of
   (a) a polyamide ester resin containing photopolymerizable groups comprising the following structure:

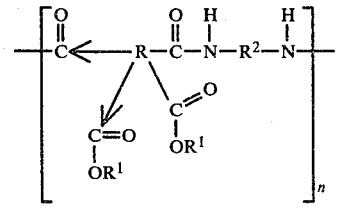

wherein →denotes isomerism, R is an aromatic radical, $R^1$ is an organic radical containing a photo polymerizable olefinic double bond, $R^2$ is an aromatic, aliphatic or cycloaliphatic radical and n is a positive integer sufficiently large to provide the resin with a weight average molecular weight of about 5,000 to 75,000 determined by gel permeation chromatography;
   (b) solvent for the resin;
   (c) radiation sensitive polymerizable polyfunctional acrylate compound and
   (d) photopolymerization initiator of an aromatic biimidazole;

wherein the polyamide ester resin being converted by heating to a polyimide structure.

2. The electrical device of claim 1 in which the polyamide ester resin of the composition comprises R from pyromellitic dianhydride, $R^1$ from hydroxy alkyl methacrylate or hydroxy alkyl acrylate and $R^2$ from an aromatic diamine.

3. The electrical device of claim 1 in which the polymerizable polyfunctional acrylate of the composition is selected from the group consisting of trimethylol propane trimethacrylate, trimethylol propane triacrylate, trimethylol propane ethoxylate trimethacrylate, trimethylol propane ethoxylate triacrylate, trimethylol propane polyethoxylate trimethacrylate, trimethylol propane polyethoxylate triacrylate, pentaerythritol triacrylate, polyethylene glycol diacrylate, triethylene glycol diacrylate, polyethylene glycol dimethacrylate, polymethylene diacrylate, polymethylene dimethacrylate, trimethylene glycol dimethacrylate and mixtures thereof.

4. The electrical device of claim 3 in which the composition contains about 0.1-10% by weight, based on the weight of the resin, of a leuco dye.

5. The electrical device of claim 4 in which the leuco dye is an alkyl amino-aromatic alkane.

6. The electrical device of claim 3 or 4 in which the photopolymerization initiator is bis(2-o-chlorophenyl-4,5-diphenyl imidazolyl) or bis[2-o-chloro-phenyl-4,5-di(m-methoxyphenyl) imidazolyl].

7. The electrical device of claim 3 or 4 in which the composition contains in addition to the photopolymerization initiator about 0.1-10% by weight based on the weight of the resin, of a photosensitizer.

8. The electrical device of claim 1 in which the polyamide ester resin is of pyromellitic dianhydride esterified with hydroxyethyl methacrylate and reacted with oxydianiline, the polyfunctional acrylate compound is trimethylol propane polyethoxylate having a weight average molecular weight of about 500-1500, the photopolymerization initiator is bis(2-o-chlorophenyl-4,5-diphenyl imidazolyl), and the composition contains about 0.1-10% by weight, based on the weight of the resin, of tris(diethylamino-o-tolyl) methane, and about 0.1-10% by weight, based on the weight of the resin, of a photosensitizer of tetramethyldiaminobenzophenone.

9. The electrical device of claim 1 in which the polyamide ester is of pyromellitic dianhydride, esterified with hydroxy ethyl methacrylate and reacted with oxydianiline, the polyfunctional acrylate is trimethylol propane trimethacrylate or trimethylol propane triacrylate, the polymerization initiator is bis(2-o-chlorophenyl-4,5-diphenyl imidazolyl) and the composition contains about 0.1-10% by weight, based on the weight of the resin, of tris(diethyl amino-o-tolyl) methane and about 0.1-10% by weight, based on the weight of the resin, of a photosensitizer of tetramethyldiaminobenzophenone.

10. The electrical device of claims 8 or 9 which is a capacitor, semiconductor, multilayer circuit, printed circuit or an integrated circuit.

* * * * *